United States Patent

Hedberg

[11] Patent Number: 6,137,311
[45] Date of Patent: Oct. 24, 2000

[54] FAILSAFE INTERFACE CIRCUIT

[75] Inventor: Mats Hedberg, Haninge, Sweden

[73] Assignee: Telefonaktiebolaget LM Ericsson, Stockholm, Sweden

[21] Appl. No.: 09/214,705

[22] PCT Filed: Jul. 11, 1997

[86] PCT No.: PCT/EP97/03700

§ 371 Date: Jan. 11, 1999

§ 102(e) Date: Jan. 11, 1999

[87] PCT Pub. No.: WO98/02965

PCT Pub. Date: Jan. 22, 1998

[30] Foreign Application Priority Data

Jul. 12, 1996 [DE] Germany ............... 196 28 270

[51] Int. Cl.[7] ............... H03K 19/0175; H03K 19/003
[52] U.S. Cl. ............... 326/68; 326/81; 326/21
[58] Field of Search ............... 326/83, 68, 62, 326/63, 80, 81, 86, 21

[56] References Cited

U.S. PATENT DOCUMENTS

| 4,616,143 | 10/1986 | Miyamoto | 326/88 |
| 5,130,883 | 7/1992 | Edwards | 361/91.1 |
| 5,319,259 | 6/1994 | Merrill | 326/21 |
| 5,397,941 | 3/1995 | Merrill | 326/68 |

FOREIGN PATENT DOCUMENTS

| 621 692 A2 | 10/1994 | European Pat. Off. . |
| 668 658 A2 | 8/1995 | European Pat. Off. . |
| 38 27 730C1 | 12/1989 | Germany . |
| 94/18755 | 8/1994 | WIPO . |
| 94/29963 | 12/1994 | WIPO . |
| 95/06357 | 3/1995 | WIPO . |

OTHER PUBLICATIONS

U. Tietz, Ch. Schenk, "Halbleiter–Schaltungstechnik,", Springer–Verlag Berlin, Heidelberg, New York 1974.

*Primary Examiner*—Michael Tokar
*Assistant Examiner*—James H. Cho
*Attorney, Agent, or Firm*—Burns, Doane, Swecker & Mahtis, L.L.P.

[57] ABSTRACT

A fail-safe interface circuit comprises at least one semiconductor switching circuit (1) with a first link terminal (2), a second link terminal (4) and a control terminal (6). To connect a first and second circuit (8, 10) attached to the first and second link terminal (2, 4), respectively, a potential difference between the control terminal (6) and one of the link terminals (2, 4) is raised above a predetermined threshold value. To avoid any flow of current from the second circuit (10) to the first circuit (8) or vice versa when the interface circuit is powered off, the maximum potential at the first and second link terminal (2,4) is actively fed back to the control terminal (6) of the semiconductor switching circuit (1).

37 Claims, 10 Drawing Sheets

FAILSAFE INTERFACE CIRCUIT

BACKGROUND OF THE INVENTION

1. Field of the Invention

The present invention relates to an failsafe interface circuit for the input and output of digital signals and a method for the failsafe operation of an interface circuit.

Currently, a variety of concepts for digital interface logic circuitry is known. Early concepts are diode-transistor logic DTL, transistor-transistor logic TTL and emitter coupled logic ECL which concepts are used with digital logic circuits as well as digital signaling between circuits and circuit boards.

Further approaches are based on MOS-processes (metal oxide semiconductor processes) which allow for advantages as higher packaging density or lower power consumption. Due to these advantages the MOS-processes now are widely used for very large scale integrated circuits such as semiconductor memories, microcomputers and circuits for the digital signal processing.

In particular the so called CMOS-technology wherein MOS-transistors of both the n-channel type and the p-channel type, i.e. PMOS-transistors and NMOS-transistors are integrated on a single chip has been proven to be extremely useful for such applications. One reason is that the combination of PMOS- and NMOS-transistors allows to achieve almost no zero signal current and a significantly reduced power loss.

Further, the transfer characteristics of circuits constituting switching circuits can be very steep in case PMOS- and NMOS-transistors are actuated reciprocally. The CMOS-technology allows for a relatively low output resistance defined through the resistance of the drain source path of the respective PMOS- and NMOS-transistors. This is a further reason why CMOS-technology has gained significant importance for the design of digital circuitry.

Typical applications are interface circuits for the transmission of digital data with a high transfer rate, e.g., the differential transmission and reception of digital data using a pair of transmission lines. Here, approaches like differential positive emitter coupled logic DPECL, low voltage differential signaling LVDC and grounded low voltage differential signaling GLVDS are used. All these approaches use differential signaling to keep differential voltages across a pair of transmission lines as low as possible. This in turn keeps the power to be transmitted over these transmission lines having low impedances within reasonable limits.

DESCRIPTION OF PRIOR ART

FIG. 18 shows an example for an interface circuit well suited for such approaches and consisting of a power supply section 400 comprising an inductance 402, one PMOS-transistor 404, and one NMOS-transistor 406. Further, the output terminals of the power supply sections are connected to the input terminals of a switching section 408 comprising two pairs of PMOS- and NMOS-transistors, each pair constituting a switching circuit 410, 412, respectively. These switching circuits are connected to two input terminals of an output section 414 again comprising two pairs of PMOS- and NMOS-transistors 416 and 418 that can be used to selectively apply the potential at the input terminals of the output section 414 to an output terminal 420. This output terminal is connected to, e.g., one line of a pair of transmission lines.

The interface circuit shown in FIG. 18 is used to output digital signals on symmetrical low impedance transmission lines or two asymmetric low impedance transmission lines. To this end the reactance circuit receives energy from a voltage source while the PMOS- and NMOS-transistor pairs 410 and 412 forward this stored energy to the output section 414 during a discharge phase. By means of appropriately setting the duration of the charging phase and the discharging phase, it is possible to provide the output section 414 with a supply voltage suitable for power efficient operation without dissipating large amounts of power and thus without generating a large amount of heat. This is a prerequisite for integrating such interface circuits into a single CMOS integrated circuit.

One problem with such interface circuits is that they are not failsafe. In particular, in case the interface circuit connected to the transmission line is powered off or its supply section is powered off any current to or from the output terminal 420 must be avoided to achieve a strict decoupling of different sections in the interface circuit. If some or all sections comprise PMOS-transistors the supply voltage equals ground potential when the interface circuit is powered off. As soon as the drain or source electrodes of PMOS-transistors have a higher potential than the respective control electrodes these PMOS-transistors are turned on and backward currents I3–I6 begin to flow through these PMOS-transistors. This, however, harms the free floating function of the overall transmission system where it is assumed that powered off interface circuits are connected with a high impedance to the transmission lines.

An additional problem with respect to this type of interface circuit is the so called latchup phenomenon inherent to the CMOS-technology and illustrated in FIG. 19 and 20.

CMOS-technology requires the formation of both NMOS- and PMOS-transistors on a single substrate. Further, one possibility to isolate transistors against a substrate is the embedding of these transistors in insulating regions, e.g., the N-well 422 shown in FIG. 19.

This, however, leads to the formation of parasitic diodes 424 to 434 between semiconductor regions of a different conductivity type and thus also to the formation of parasitic bipolar devices of the PNP-type 436 and the NPN-type 438. As is shown in FIG. 20, the parasitic bipolar devices can form a four layer PNPN thyristor structure. If this thyristor structure is turned on, the interface circuit destroys itself by a conduction which is known as latchup phenomenon.

To avoid this latchup phenomenon the N-well and the spacings between the source/drain regions of the different MOS-transistors must be carefully chosen to minimize the current gain of the parasitic bipolar transistors 436, 438. In addition, it is necessary to control parasitic diodes between the source/drain regions of the transistors and the N-well so that they are not forward biased. One approach is to apply the highest potential in the interface circuit to the N-well of the PMOS-transistors.

However, while such an approach usually avoids the latchup phenomenon in an interface circuit it will not work when a source or drain electrode of a PMOS-transistor is externally connected to, e.g., a transmission line with a positive potential when the interface circuit is powered off. Under such a condition a current will flow from the external transmission line via the drain or source electrode of the PMOS-transistor and the parasitic diode to the N-well 422 connected to the internal supply potential.

In other words, in known interface circuits it is impossible to control the potential of insulating well regions in case the interface circuit is powered off. However, this leads to a backward feed current via parasitic diodes.

SUMMARY OF THE INVENTION

In view of the above, the object of the present invention is to provide an interface circuit which is failsafe when the interface circuit is powered off.

Thus, according to the present invention a failsafe interface circuit comprises at least one semiconductor switching circuit with a first link terminal, a second link terminal and a control terminal. To connect a first and second circuit attached to the first and second link terminal, respectively, a potential difference between the control terminal and one of the link terminals is raised above a predetermined threshold value. When the interface circuit is powered off, the maximum potential at the first and second link terminal is actively fed back to the control terminal in case the interface circuit or one of the first and second circuits is powered off.

Thus, according to the present invention, a failure in the interface circuit where a semiconductor switching circuit is turned on when the interface circuit is powered off is safely prevented since in this case the control terminal is disconnected from the related control logic and follows the highest potential in the interface circuit.

According to a preferred embodiment of the invention there is provided a failure prevention circuit adapted to apply the maximum potential of the first link terminal and the second link terminal to an insulating region of the semiconductor switching circuit when the failsafe interface circuit is powered off.

Therefore, no backward feed or latchup phenomenon occurs and no current flows in parasitic diodes of the semiconductor switching circuit when the interface circuit is powered off. Also, a turning on of a parasitic thyristor formed by such parasitic diodes can be prevented effectively since the potential of all insulation regions are actively controlled to the most positive potential in the failsafe interface circuit both when the power supply is turned on and when the power supply is turned off.

According to a further preferred embodiment of the invention the failsafe interface circuit comprises a power supply section and a differential output section. This allows to provide differential signals while keeping differential voltages across pairs of signal transmission lines low without any adverse effect on the quality of data transmission. Since the differential signaling approach leads to a low power dissipation per unit area an integration into a single CMOS-circuit is possible since precautions are taken to avoid any backward phenomenon or latchup phenomenon in the integrated interface circuit.

Embodiments of the present invention are described in the following description in conjunction with the accompanying drawing in which:

FIG. 14 shows a further failsafe interface circuit applied to transmission of digital data wherein switching noise can be efficiently compensated for;

FIG. 15 shows a further failsafe interface circuit applied to differential transmission of digital data wherein switching noise can be efficiently compensated for;

DESCRIPTION OF PREFERRED EMBODIMENTS

Figure 1:
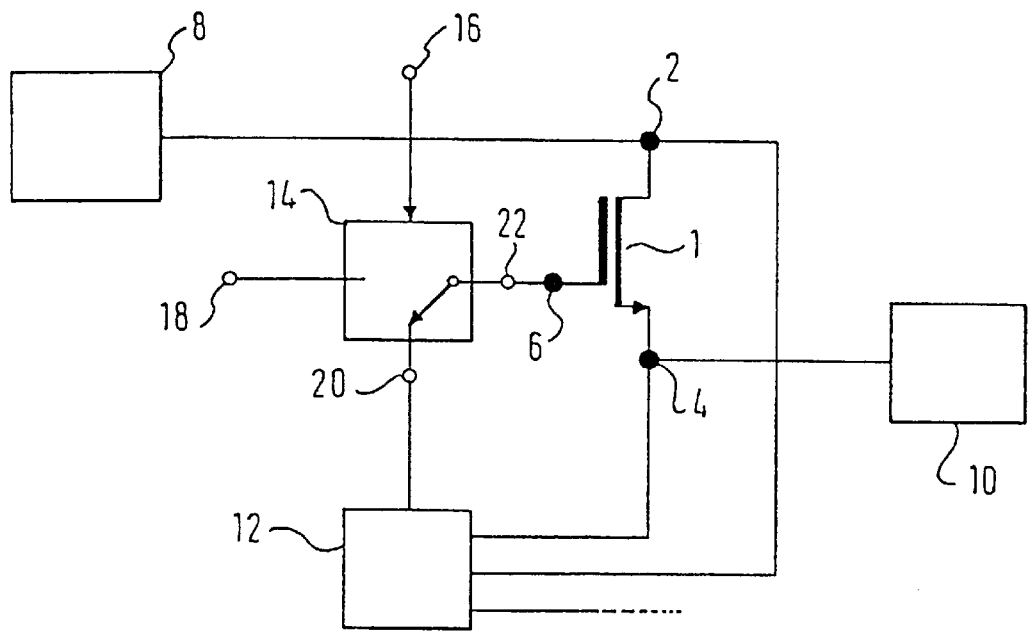
FIG. 1 shows a semiconductor switching circuit for the failsafe interface circuit.

FIG. 1 shows a first embodiment of the failsafe interface circuit that is realized with a PMOS-transistor 1 that has a drain electrode 2, a source electrode 4 and a control electrode 6. Another possibility discussed below is to couple an additional NMOS-transistor across the PMOS-transistor 1 to increase the operative range of the semiconductor switching circuit.

The PMOS-transistor connects a first circuit 8 and a second circuit 10 when a potential difference between either the control electrode 6 and drain electrode 2 or the control electrode 6 and the source electrode 4 exceeds a predetermined threshold value. Therefore, a suitable control potential is supplied to the control electrode 6 to switch the PMOS-transistor 1 on when the first circuit 8 must be connected to the second circuit 10.

With known interface circuits a particular problem arises during power off, i.e. when a low potential is supplied to the control electrode 6 of the PMOS-transistor 1. In case one of the first and second circuit 8, 10 supplies a high potential to either the drain electrode 2 or the source electrode 4 of the PMOS-transistor 1 a potential difference between the drain electrode 2 or the source electrode 4 and the control electrode 6 of the PMOS-transistor 1 is higher than the turn on threshold voltage thereof so that the interface circuit connects the first and second circuit 8, 10 also when it is powered off.

To avoid this problem, according to the present invention it is proposed to provide a conduction prevention circuit adapted to apply the maximum potential of the drain electrode 2 and the source electrode 4 of the PMOS-transistor 1 to its control electrode 6 when the failsafe interface circuit is powered off.

The conduction prevention circuit comprises a maximum generating circuit 12 that generates the maximum of the potential at the drain electrode 2 and the source electrode 4 of the PMOS-transistor 1. The output potential of the maximum generating circuit 12 is supplied to a selector circuit 14 having three input terminals 16, 18, and 20 and one output terminal 22 being connected to the control electrode 6 of the PMOS-transistor 1.

The first input terminal 16 receives a signal indicating that the failsafe interface circuit is powered off, e.g. the supply potential of the interface circuit. The second input terminal 18 receives the normal control potential for the control electrode 6 of the PMOS-transistor 1 supplied via the output terminal 22 in case the failsafe interface circuit is powered on. Further, when the signal received via the input terminal 16 indicates that the failsafe interface circuit is powered off the selector circuit 14 switches from the input terminal 18 supplying the normal control potential to the input terminal 20 receiving the output potential of the maximum generating circuit 12, i.e. the maximum potential of the drain electrode 2 and the source electrode 4 of the PMOS-transistor 1.

Therefore, when the failsafe interface circuit is powered off always the maximum potential of the drain electrode 2 and the source electrode 4 is actively supplied to the control terminal 6 of the PMOS-transistor 1. Thus, a failure in the interface circuit is safely prevented since the control electrode 6 of the PMOS-transistor 1 is disconnected from the control logic when the failsafe interface circuit is powered off and follows the highest potential of the drain electrode 2 and the source electrode 4 of the PMOS-transistor 1.

Figure 2:
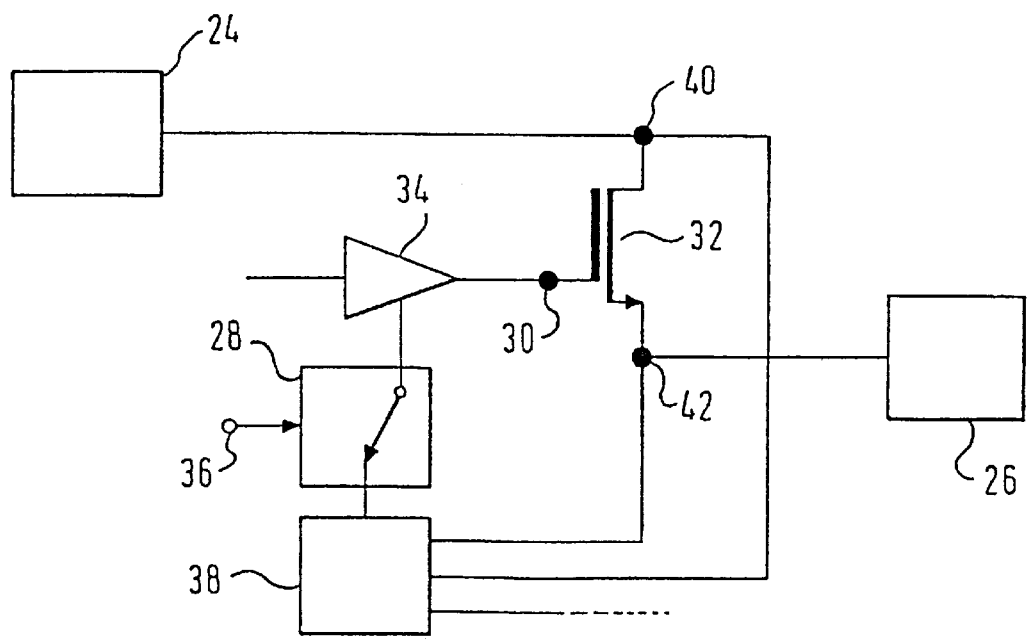
FIG. 2 shows a further semiconductor switching circuit for the failsafe interface circuit.

FIG. 2 shows a further embodiment of the failsafe interface circuit connecting two circuits 24 and 26 where a selector circuit 28 is not directly connected to a control electrode 30 of a PMOS-transistor 32 but outputs a supply voltage for a control circuit 34 driving the control electrode 30 of the PMOS-transistor 32. While the selector circuit 28 also receives a signal indicating that the failsafe interface circuit is powered off via an input terminal 36 and the maximum potential at a drain electrode 40 and the source electrode 42 of the PMOS-transistor 32 generated in a maximum generating circuit 38 it does not supply directly the maximum potential to the control electrode 30 of the PMOS-transistor 32. In particular, the selector circuit 28 does not lie directly in the signal path leading to the control electrode 30 of the PMOS-transistor 32. Thus, according to this embodiment the additional circuitry necessary to achieve failsafety for the interface circuit has no impact on the overall timing performance of the failsafe interface circuit.

Figure 20:
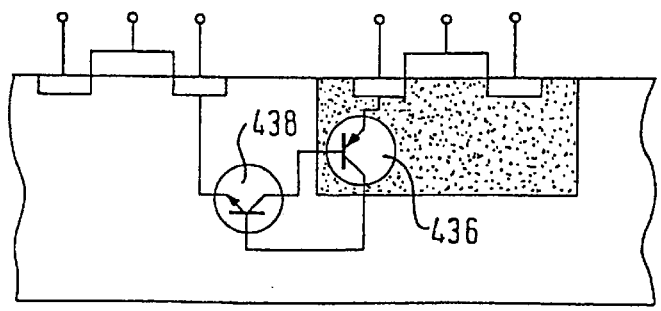
FIG. 20 shows the formation of a parasitic thyristor structure in a CMOS-circuit.

A further embodiment aims at the prevention of any backward feed effects in the interface circuit. In particular, this further embodiment aims at avoiding any backward feed current via parasitic diodes between the drain electrode or the source electrode and the n-channel of the PMOS-transistor and the prevention of turning on of parasitic thyristor structures shown in FIG. 20.

Figure 3:
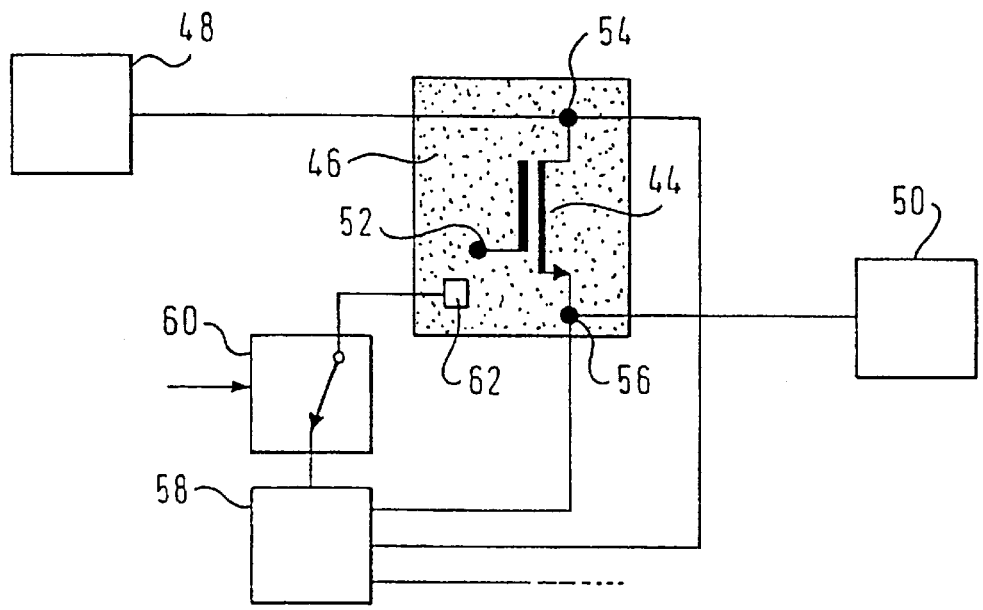
FIG. 3 shows a further semiconductor switching circuit embedded in an insulating region.

FIG. 3 shows an embodiment where a PMOS-transistor 44 is embedded in an insulating region 46 realized as N-well. Similar to the embodiments described with respect to FIG. 1 and FIG. 2 the PMOS-transistor 44 is adapted to connect a first circuit 48 and a second circuit 50 in case a potential difference between a control electrode 52 and one of the drain electrode 54 and the source electrode 56 thereof exceeds a predetermined threshold value.

Here, the maximum potential of the drain electrode 54 and the source electrode 56 of the PMOS-transistor 44 generated in a maximum generating circuit 58 is not supplied to the control electrode 52 but via a selector circuit 60 to a contact 62 of the insulating region 46 embedding the PMOS-transistor 44. Therefore, no backward feed current flows in parasitic diodes between the drain electrode 54 or the source electrode 56 of the PMOS-transistor 44 and the insulating region 46. Also, a turning on of the parasitic thyristor shown in FIG. 20 can be prevented effectively since the potential of the insulating region 46 is actively controlled to the most positive potential in the failsafe interface circuit both when the power supply is turned on and when the power supply is turned off. Therefore, the failsafe interface circuit uses the maximum potential that may occur to actively prevent the occurrence any failure therein.

Figure 4:
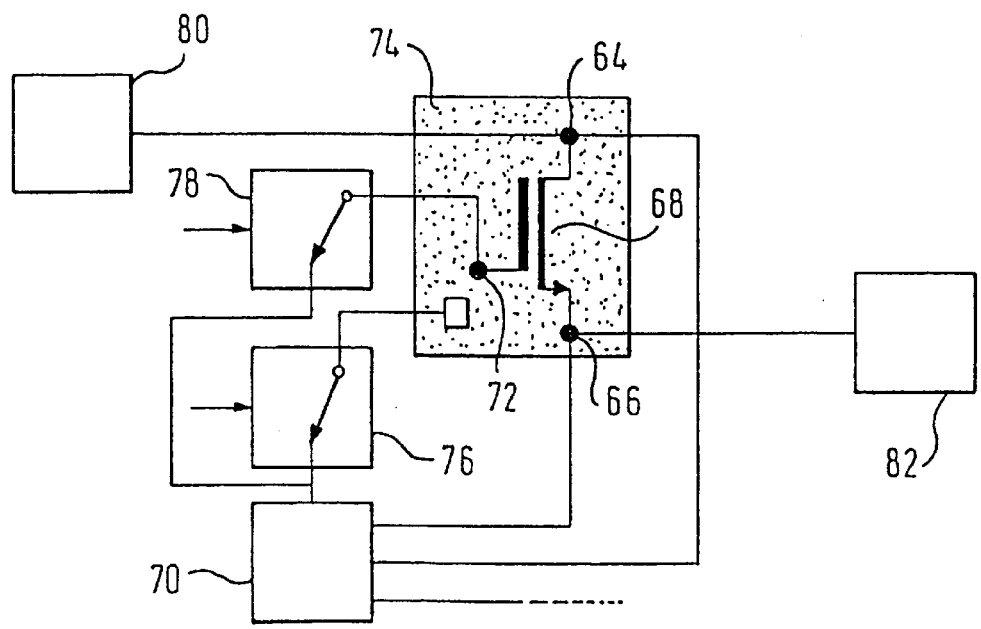
FIG. 4 shows a further semiconductor switching circuit embedded in an insulating region.

FIG. 4 shows a further embodiment where the advantages of the embodiments explained above are combined. Here, a maximum potential of a drain electrode 64 and a source electrode 66 of a PMOS-transistor 68 generated in a maximum generating circuit 70 is supplied to both a control electrode 72 and an insulating region 74 thereof. Therefore the PMOS-transistor 68 can never be turned on in case the interface circuit is powered off and also any backward feed or latchup phenomenon is safely avoided by actively tying the insulating region 74 to the most positive potential in the failsafe interface circuit.

The embodiment shown in FIG. 4 comprises two selector circuits 76 and 78 used to feedback the maximum potential outputted by the maximum generating circuit 70 to the control electrode 72 and the insulating region 74, respectively.

Of course it is also possible that the selector circuit 78 feeding the control electrode 72 of the PMOS-transistor 68 is not directly connected thereto but to a control amplifier (not shown) that feeds the control electrode 72. This allows to eliminate any impact on the timing performance on the failsafe interface circuit when connecting a first and a second circuit 80, 82. Further, the first and second selector circuits 76, 78 can be combined into a single selector circuit that connects both the control electrode 72 and the insulating region 74 of the PMOS-transistor 68 to the output of the maximum generating circuit 70.

Figure 5:
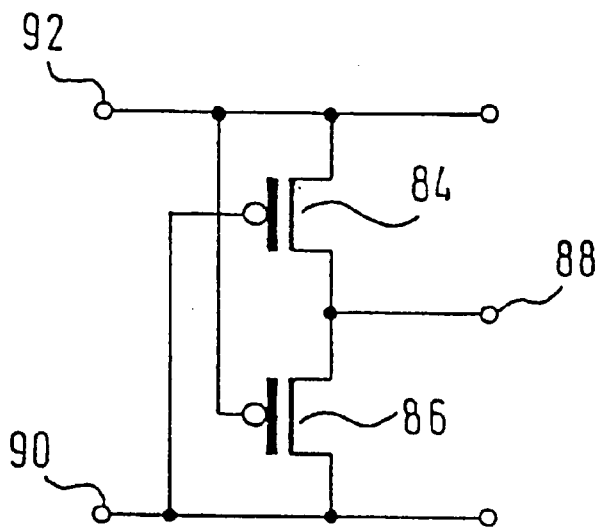
FIG. 5 shows a maximum generating circuit for generating a maximum potential from two input potentials.

FIG. 5 shows a basic structure of a circuit for generating a maximum potential from two input potentials that may be used as maximum generating circuit. This maximum generating circuit comprises a first PMOS-transistor 84 and a second PMOS-transistor 86 with the common electrode being connected to the output terminal 88 of the maximum generating circuit. The control electrode of the first PMOS-transistor 84 and the source electrode of the second PMOS-transistor 86 are connected to a first input terminal 90 of the maximum generating circuit. The control electrode of the second PMOS-transistor 86 and the drain electrode of the first PMOS-transistor 84 are connected to a second input terminal 92 of the maximum generating circuit.

When the input potential at the first input terminal 90 is higher than the input potential at the second input terminal 92 the potential of the control electrode of the second PMOS-transistor 86 is lower than at the source electrode thereof so that this second PMOS-transistor 86 is turned on. Thus, the potential at the first input terminal 90 is supplied to the output terminal 88.

To the contrary, if the input potential at the second input terminal 92 is higher than the input potential at the first input terminal 90 the first PMOS-transistor 84 is similarly turned on while the second PMOS-transistor 86 remains turned off so that the input potential at the second input terminal 92 is supplied to the output terminal 88.

Figure 6:
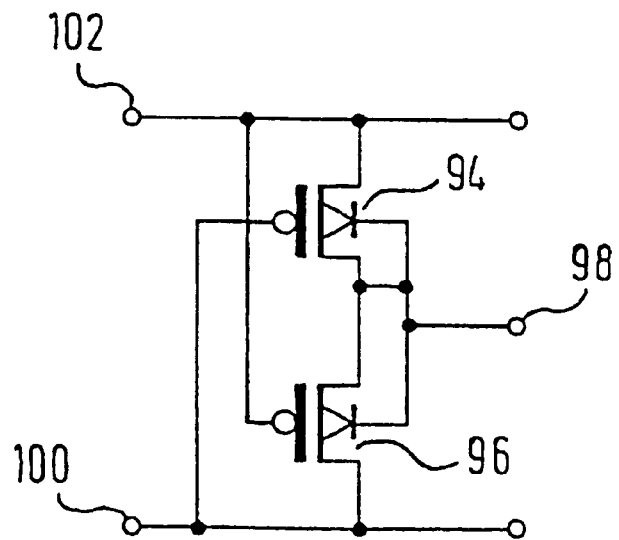
FIG. 6 shows a further maximum generating circuit for generating a maximum potential from two input potentials.

FIG. 6 shows a modification of the maximum generating circuit shown in FIG. 5 where a first PMOS-transistor 94 and a second PMOS-transistor 96 are embedded in insulating regions adapted to be biased to the maximum potential at the output terminal 98 of this maximum generating circuit. As outlined above, this allows to avoid any feedback current or latchup phenomenon in the maximum generating circuit and to provide the maximum potential at the input terminals 100, 102. The maximum generating circuits according to FIG. 5 and 6 work as long as the respective difference between the potentials at the two input terminals is higher than a threshold voltage to switch on either PMOS-transistor 84, 94 or PMOS-transistor 86, 96.

However, precautions have to be taken when the potential difference at the input terminals is lower than this threshold voltage. The reason for this is that in this case none of the PMOS-transistors will be turned on. Further, the potential of the insulating regions of the PMOS-transistors is undefined since no current forces the insulating regions to the highest potential. Also, the potential of the insulating regions can not drift so far away. It will be limited downwards by parasitic diodes and upwards by the PMOS-transistors because at least one of them will be turned on when the potential raises more than the threshold voltage to turn on either of the PMOS-transistors above the potential at the control electrodes.

Figure 7:
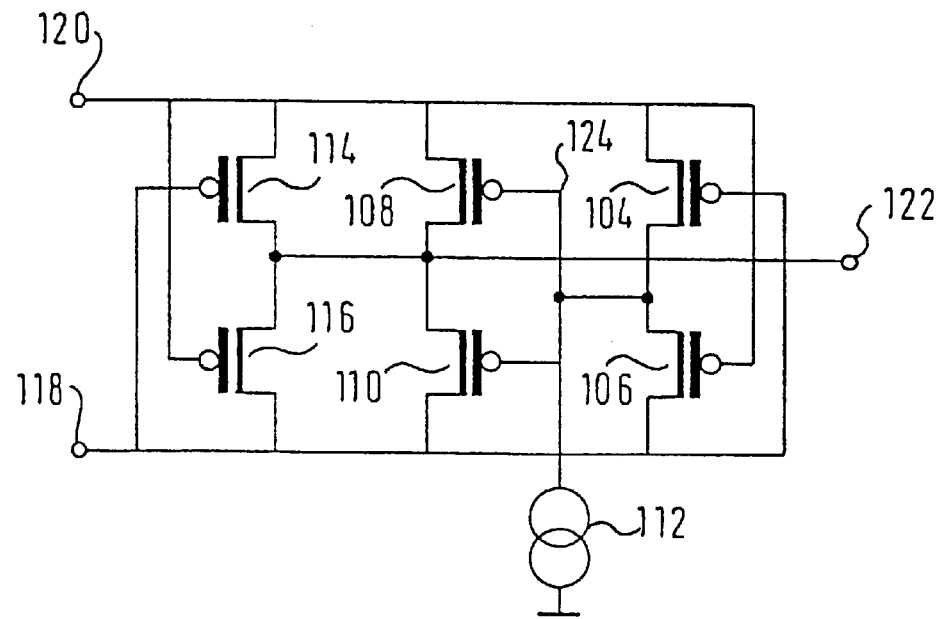
FIG. 7 shows an enhanced version of a maximum generating circuit for generating the maximum potential of two input potentials.

This problem is solved by an enhanced version of the maximum generating circuits shown in FIG. 5 and 6. This enhanced version of the maximum generating circuit is shown in FIG. 7 and comprises four additional PMOS-transistors 104, 106 and 108, 110 and a current source 112. The PMOS-transistors 104 and 106 are connected in the same way as the PMOS-transistors 114, 116 corresponding to the PMOS-transistors 84, 86 and 94, 96, respectively, to the input terminals 118 and 120 of the maximum generating circuit. Further, the PMOS-transistors 108 and 110 are connected in series between these two input terminals 118 and 120, the common electrode of these PMOS-transistors 108 and 110 being connected to an output terminal 122. Also, the current source 112 is connected to both control electrodes of the PMOS-transistors 108 and 110 and to the common electrode of the PMOS-transistors 104 and 106.

As long as the potential difference at the input terminals 118 and 120 exceeds the threshold potential for turning on either of the PMOS-transistors 114 and 116 the maximum generating circuit shown in FIG. 7 works basically in the same way as the maximum generating circuits shown in FIG. 5 and 6. In particular, either of the PMOS-transistors 114 and 104 or 116 and 106 will be turned on and give the highest potential at the input terminals 118 and 120 to the output terminal 122 and to the common electrode of the PMOS-transistors 108 and 110. Since the largest input potential is supplied to the control electrodes of the PMOS-transistors 108 and 110 they are turned off.

If the potential difference at the input terminals 118 and 120 is lower than the threshold voltage to turn on either one of the PMOS-transistors 114 and 116 or 104 and 106 they will all be turned off. In this case, a node 124 is pulled low by the current source 112 so that the PMOS-transistor 108 or 110 is turned on depending on which PMOS-transistors 108 or 110 has the highest potential at the electrode connected to either of the input terminals 118 and 120. Therefore, also when the potential difference at the input terminals 118 and 120 of the maximum generating circuit shown in FIG. 7 is lower than the threshold voltage for turning on either of the PMOS-transistors 114 and 116 or 104 and 106 this maximum generating circuit is operable to provide the maximum input potential at the output terminal 122 thereof.

Figure 8:
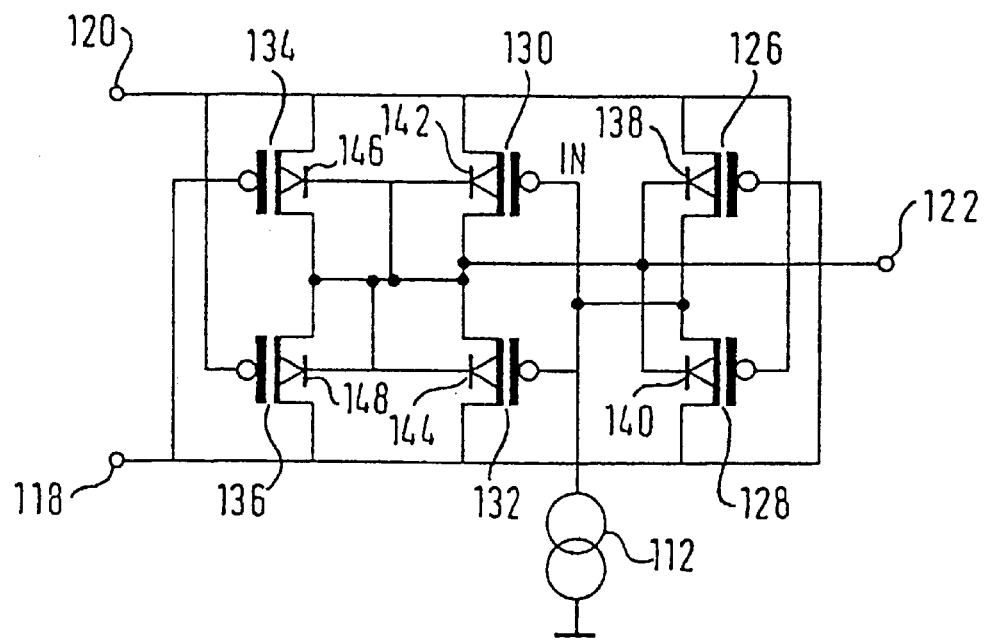
FIG. 8 shows a failsafe version of the maximum generating circuit shown in FIG. 7.

FIG. 8 shows an enhanced version of the maximum generating circuit shown in FIG. 7 where all PMOS-transistors 126 to 136 are embedded in insulating regions of the N-well type (not shown) that are connected to the maximum potential derived in this maximum generating circuit. According to this enhanced maximum generating circuit the insulating regions are always tied to the highest potential. Therefore the potentials of the insulating regions are always well defined. Also, any backward feed or latchup phenomenon can be avoided since the parasitic diodes 138 to 148 between source electrodes or drain electrodes of the PMOS-transistors 126 to 136 and the related insulating regions are continuously kept non-conductive. This allows to avoid undesired variations in PMOS device parameters, in particular when low voltage processes are used.

Figure 9:
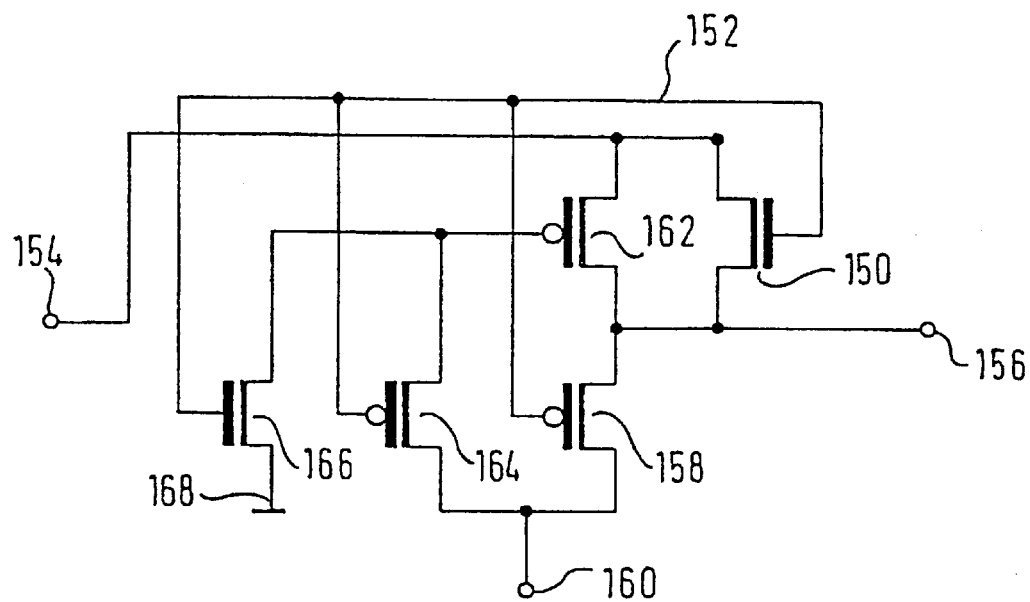
FIG. 9 shows a selector circuit to switch the maximum of two input potentials to an output terminal.

FIG. 9 shows an embodiment of a selector circuit. Here, a NMOS-transistor 150 has a control electrode connected to a power supply line 152, a drain electrode connected to a first input terminal 154, and a source electrode connected to an output terminal 156. In addition, there is provided a PMOS-transistor 158 having the control electrode connected to the first power supply line 152 and the drain electrode connected to the output terminal 156. The source electrode of this PMOS-transistor 158 is connected to a second input terminal 160 of the selector circuit. An additional PMOS-transistor 162 has its drain electrode connected to the first input terminal 154 and its source electrode connected to the output terminal 156. A further PMOS-transistor 164 has its control electrode connected to the first power supply line 152, its source electrode connected to the second input terminal 160 and the drain electrode connected to the control electrode of the PMOS-transistor 162. The control electrode of the PMOS-transistor 162 and the drain electrode of the PMOS-transistor 164 are connected via a NMOS-transistor 166 to a second power supply line 168.

When the interface circuit is powered on the selector circuit shown in FIG. 9 connects the first input terminal 154 with the output terminal 156. As shown in FIG. 1 and 4, the normal control signal is then supplied to the control electrode of the PMOS-transistor, whereby this PMOS-transistor is turned on and connects the circuits linked to the failsafe interface circuit. In this state also the potential at the first power supply line 152 is high so that the NMOS-transistors 150 and 166 are turned on. The NMOS-transistor 166 connects the second power supply line 168 with a low potential to the control electrode of the PMOS-transistor 162 which therefore is also turned on. Therefore, the first input terminal 154 is connected via the NMOS-transistor 150 and the PMOS-transistor 162 to the output terminal 156.

An important advantage of this selector circuit is that NMOS-transistor 150 and PMOS-transistor 162 are connected in parallel to connect the input terminal 154 to the output terminal 156. This increases the common mode operating range significantly.

The second operation mode of the selector circuit shown in FIG. 9 is related to the powered off interface circuit when the potential on the first supply line 152 is low. In this state the potential at the second input terminal 160 corresponds to the output potential of the maximum generating circuit and thus to the maximum potential in the interface circuit. Therefore the PMOS-transistor 158 is turned on and the potential at the second input terminal 160 is supplied to the output terminal 156 of the selector circuit. For the same reason also the PMOS-transistor 164 is turned on so that the potential at the control electrode of the PMOS-transistor 162 corresponds to the maximum potential in the interface circuit and this PMOS-transistor 162 remains turned off. The same holds true for the NMOS-transistors 150 and 166 since the potential at the respective control electrodes corresponds to the low potential on the first supply line 152.

Figure 10:
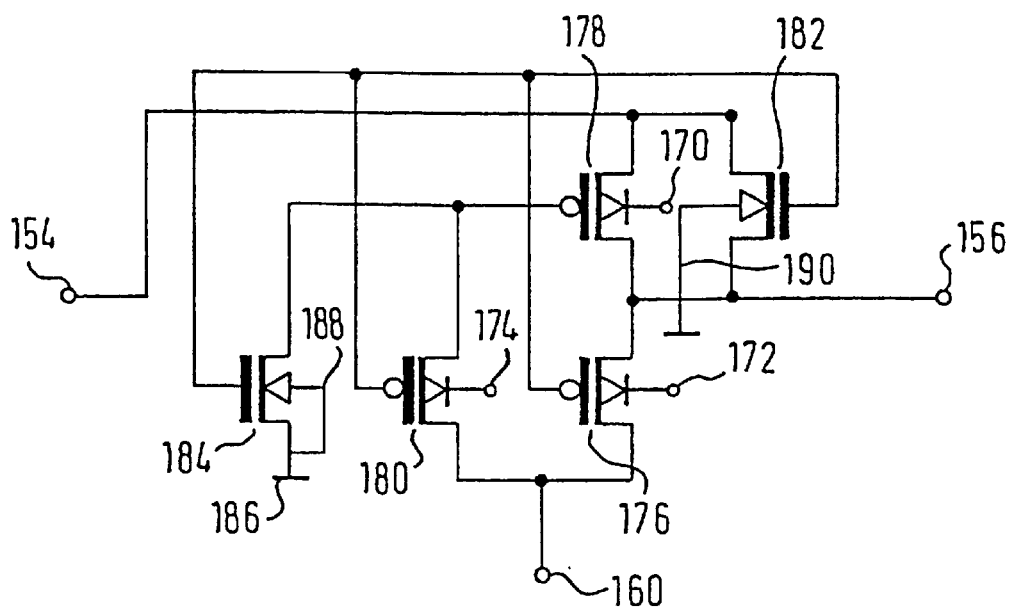
FIG. 10 shows a failsafe version of the selector circuit shown in FIG. 9.

FIG. 10 shows a selector circuit with improved failsafe capability. Terminals 170 to 174 receive the maximum of the potential at the second input terminal 160 and the VDD potential. Therefore, the maximum of the potential at the second input terminal 160 and the VDD potential is supplied to the insulating regions of the PMOS-transistors 176 to 180 so that in any case a turn on of these PMOS-transistors 176 to 180 is prevented. Therefore, the PMOS-transistors 176 to 180 are disconnected from the related control logic in case the interface circuit is powered off.

Further, all PMOS-transistors 176 to 180 and NMOS-transistors 182, 184 are provided in insulating regions. The insulating regions for the NMOS-transistors 182 and 184 are tied to the potential on a second power supply line 186 via connections 188 and 190. Further, the insulating regions of the PMOS-transistors 176 to 180 are tied to the output potential of a maximum generating circuit via the terminals 170 to 174. Thus, in the failsafe selector circuit shown in FIG. 10 the potentials of the insulating regions of the PMOS-transistors 176 to 180 are actively tied to the maximum potential in the failsafe interface circuit and the potentials for the insulating regions of the NMOS-transistors 182, 184 are constantly held at ground potential. Therefore, the selector circuit is fully failsafe without any latchup or backward feed phenomenon.

Figure 11:
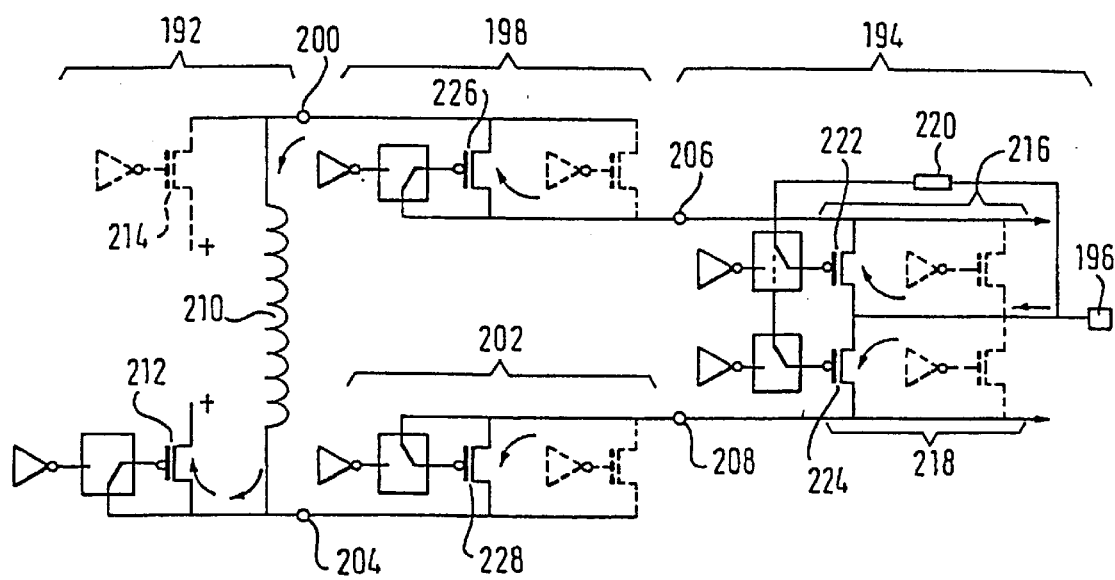
FIG. 11 shows a failsafe interface circuit applied to differential transmission of digital data.

FIG. 11 shows a further embodiment where the failsafe interface circuit is connected to a power supply circuit 192 and an output circuit 194 for driving an output terminal connected to a transmission line 196. While only a single output circuit is shown in this figure the number of output circuits according to the invention can also be greater than one. This embodiment relates to the transmission of digital data with a high transfer rate such as the differential transmission and reception of digital data.

In particular, a first semiconductor switching circuit 198 is connected to a first output terminal 200 of the power supply circuit 192 and a second semiconductor switching circuit 202 is connected to a second output terminal 204 of the power supply circuit 192. Each semiconductor switching circuit 198, 202 comprises a PMOS-transistor and an NMOS-transistor (shown in dotted lines) operatively coupled across the PMOS-transistor. As outlined above, this allows to increase the switching range of the semiconductor switching circuits 198, 202 and thus also the applicability of the failsafe interface circuit.

Further, an output terminal of the first semiconductor switching circuit 198 is connected to a first input terminal 206 of the output circuit 194 and an output terminal of the second semiconductor switching circuit 202 is connected to a second input terminal 208 of the output circuit 194.

As outlined above, the power supply circuit 192 comprises an inductance 210 and, e.g., one PMOS-transistor 212 and one NMOS-transistor 214 which are connected to the inductance 210. Through appropriately switching on and off these PMOS- and NMOS-transistors 212, 214 it is possible to set the duration of a charging phase where energy is transferred from a power source (not shown) to the inductance 210. After this charging phase the first semiconductor switching circuit 198 and the second semiconductor switching circuit 202 are actuated such that at least part of the energy stored in the inductance 210 is transferred to input terminals 206, 208 of the output circuit 194. Therefore, the potential at these input terminals 206, 208 varies in dependence of the setting of the charging and discharging phase for the inductance 210 and the actuation of the first and second semiconductor switching circuits 198, 202, respectively. In addition, the output circuit 194 comprises two additional semiconductor switching circuits 216 and 218 connecting the input terminals 206, 208, respectively, to the output terminal 196 of the output circuit 194.

As shown in FIG. 11, a potential at the output terminal 196 of the output circuit 194 is fed back via a resistor 220 to the control gates of the PMOS-transistors 222, 224 comprised in the semiconductor switching circuits 216 and 218 when the failsafe interface circuit is powered off. The semiconductor switching circuits 198 and 202, too, are provided with this failsafe capability.

As is shown in FIG. 11 to each control electrode of the PMOS-transistors 226, 228 in the semiconductor switching circuits 198, 202 a selector circuit is directly connected, respectively.

Figure 12:
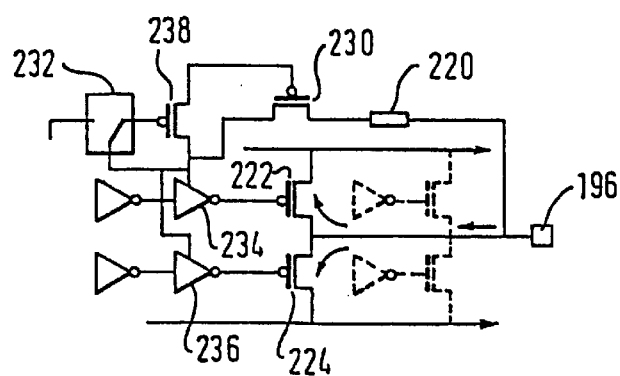
FIG. 12 shows a further failsafe interface circuit applied to differential transmission of digital data.

FIG. 12 shows a modified embodiment of the output circuit where an additional PMOS-transistor 230 is inserted into the feedback path from the output terminal 196 to the control terminals of the PMOS-transistors 222, 224 in the semiconductor switching circuits 216, 218. Also, the related selector circuit 232 is not directly lying in the signal path to the control electrodes of these PMOS-transistors 222, 224 but supplies the potential at the output terminal 196 of the output circuit 194 as power supply potential to control, amplifiers 234 and 236 driving the control electrodes of these PMOS-transistors 222, 224 when the failsafe interface circuit is powered off. Further, when the failsafe interface circuit is powered off the selector circuit 232 connects the potential at the source electrode of PMOS-transistor 238 to a control electrode of this PMOS-transistor 238.

As mentioned above, NMOS-transistors are operatively coupled across the PMOS-transistors in the semiconductor switching circuits 198, 202, 216 and 218 to enlarge the operative range of these semiconductor switching circuits when the failsafe interface circuit is powered on.

Also, as indicated by arrows in FIG. 11 and 12 the different backward feed paths in the failsafe interface circuit are cut off at different positions, e.g., the semiconductor switching circuits 198 and 202 or the semiconductor switching circuits 216 and 218.

According to the present invention there exists no particular restriction where to cut off such backward feed paths. It should be noted that the cut off at the semiconductor switching circuits 212 or 198 and 202 has the advantage that no highspeed demands exist for the control of the PMOS- and NMOS-transistors comprised in these semiconductor switching circuits 212, 198, 202. In this case precautions must be taken to avoid that output terminals, e.g., the output terminals 200 and 204 are connected to each other via the common signal lines connected to the input terminals 206 and 208 and the output circuit 194. Therefore, a preferred way to prevent any backward feed phenomenon in the interface circuit is to use the circuits according to the invention at the semiconductor switching circuits 216 and 218 since with this approach each input terminal 206 and 208 of the output circuit is completely separated from the output terminal 196.

In particular, with respect to the embodiment shown in FIG. 12 this has no impact on the bandwidth of the failsafe interface circuit since the selector circuit 232 does not lie in the signal line feeding the control electrodes of the PMOS-transistors 222, 224 in the semiconductor switching circuits 216 and 218.

Further, this embodiment has the advantage that the PMOS-transistor 230 is only activated during the powered off state and when the output potential at the output terminal 196 is raised. Otherwise, this PMOS-transistor 230 will disconnect the resistor 220 from the internal supply node to avoid unnecessary power dissipation in case this resistor has only a small resistance value.

Still further, the additional selector circuit 232 allows to guarantee the failsafe feature of the PMOS-transistor 238 connecting the internal power supply to the amplifying circuits 234 and 236 during the powered on state of the output circuit.

Thus, the control electrodes of the PMOS-transistors 222, 224 follow the raised output signals during powered off states under all circumstances so that these PMOS-transistors 222, 224 are turned off to avoid any potential backward feed current or any latchup phenomenon in the failsafe interface circuit.

Figure 13:
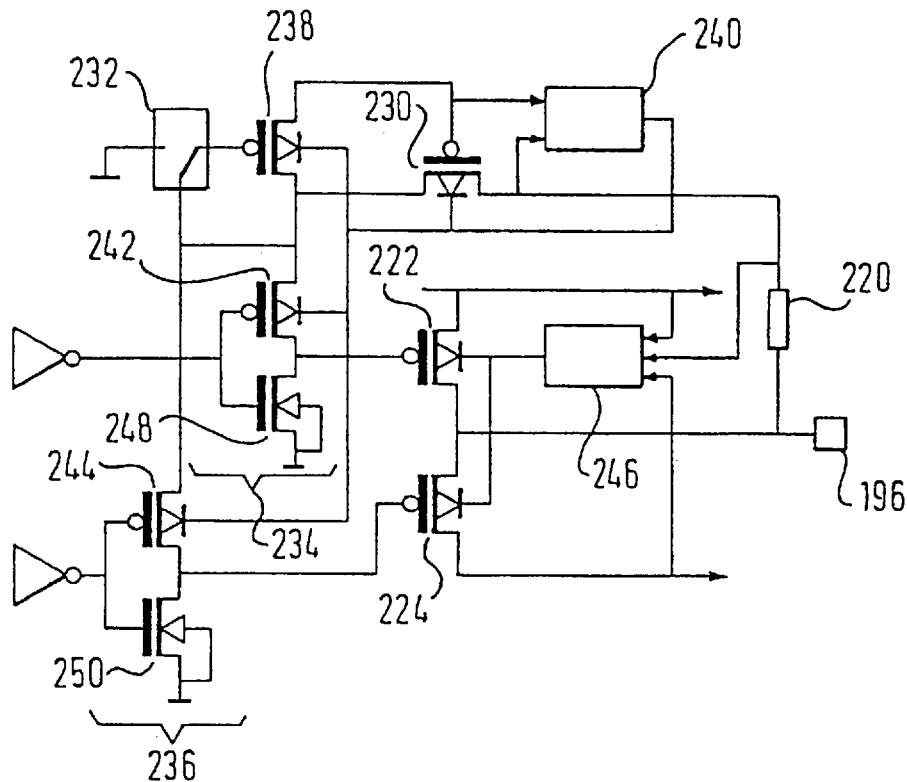
FIG. 13 shows a modification of the failsafe interface circuit shown in FIG. 12.

FIG. 13 shows a detailed circuit diagram of the output circuit 194. A first maximum generating circuit 240 derives the maximum of the potential on the signal line connecting the PMOS-transistor 230 and the resistor 220 and the potential at the control electrode of the PMOS-transistor 230. This maximum potential is used to bias the insulating regions of the PMOS-transistor 238 and all PMOS-transistors 230, 242, 244 comprised in the control circuits 239, 236 driving the control electrodes of the PMOS-transistors 222, 224 in the semiconductor switching circuits 216 and 218.

In addition, there is provided a second maximum generating circuit 246 that derives the maximum potential at the input terminals 206 and 208 of the output circuit 194 and the output terminal 196 thereof. This maximum potential is used to bias insulating regions of the PMOS-transistors 222, 224 in the semiconductor switching circuits 216 and 218. To also ensure that all NMOS-transistors 248, 250 comprised in the control circuits 234, 236 of these PMOS-transistors 222, 224 are failsafe the insulating regions of these NMOS-transistors 248, 250 are tied to ground potential.

All input signals to the maximum generating circuits can be summed up in one single maximum generating circuit and distributed to all involved PMOS-transistors. However, in some instances it is beneficial to separate the considered potentials for the different insulating regions since the higher the potential of the insulating regions is in comparison to the drain and source electrodes of the PMOS-transistors the weaker the PMOS-transistors are due to an increased threshold voltage. Therefore, when the output circuit works far below the supply potential it is beneficial to let the insulating regions follow this lower potential level.

Figure 14:
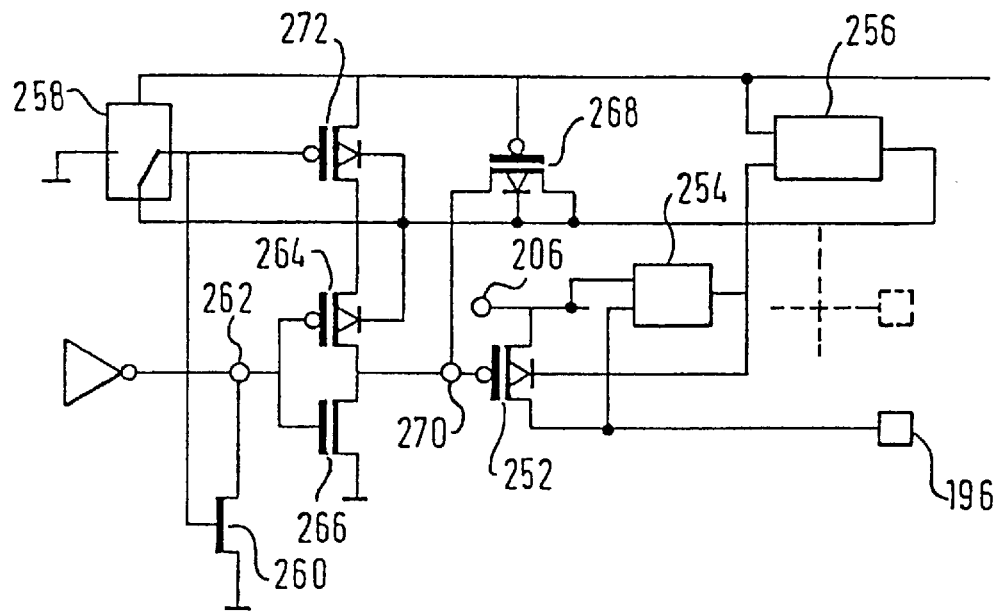

Another embodiment being related to the prevention of failures in interface circuits due to noise and ripples is shown in FIG. 14. To overcome this problem, it is necessary to achieve an enhanced decoupling of the potentials at the input terminals 206 and 208 of the output circuit 194, in particular when the decouplings are situated off chip after the output buffers. Here decoupling means a filtering process for the signals being transferred by the interface circuit.

One approach to overcome the problem with power fed noise is to cut the internal supply connections from the previous circuit to the input terminals 206, 208 of the output circuit 194 and carry out the decoupling or filtering separately from the interface circuit. One option is to embody the previous circuit and the internal supply connections connected thereto on a single integrated circuit and to lead these internal supply lines off the integrated circuit onto the capsule level or the printed circuit board level to carry out the decoupling/filtering for the noise and ripple components in the supplied potentials.

After the decoupling the supplied potentials are again fed back onto the integrated circuit. This embodiment of the invention requires at least one additional pin to get onto the capsule level or the printed circuit board level and then back onto the integrated circuit with essentially noise free potentials on the supply lines to the input terminals 206, 208 of the output circuit 194.

As outlined above the number of output circuit is not restricted to one but can also be greater than one. In this case not only care has to be taken with respect to noise and ripple components but also with respect to the strict separation of the different output circuits from each other so as to avoid any interaction between the different output circuits.

Figure 15:
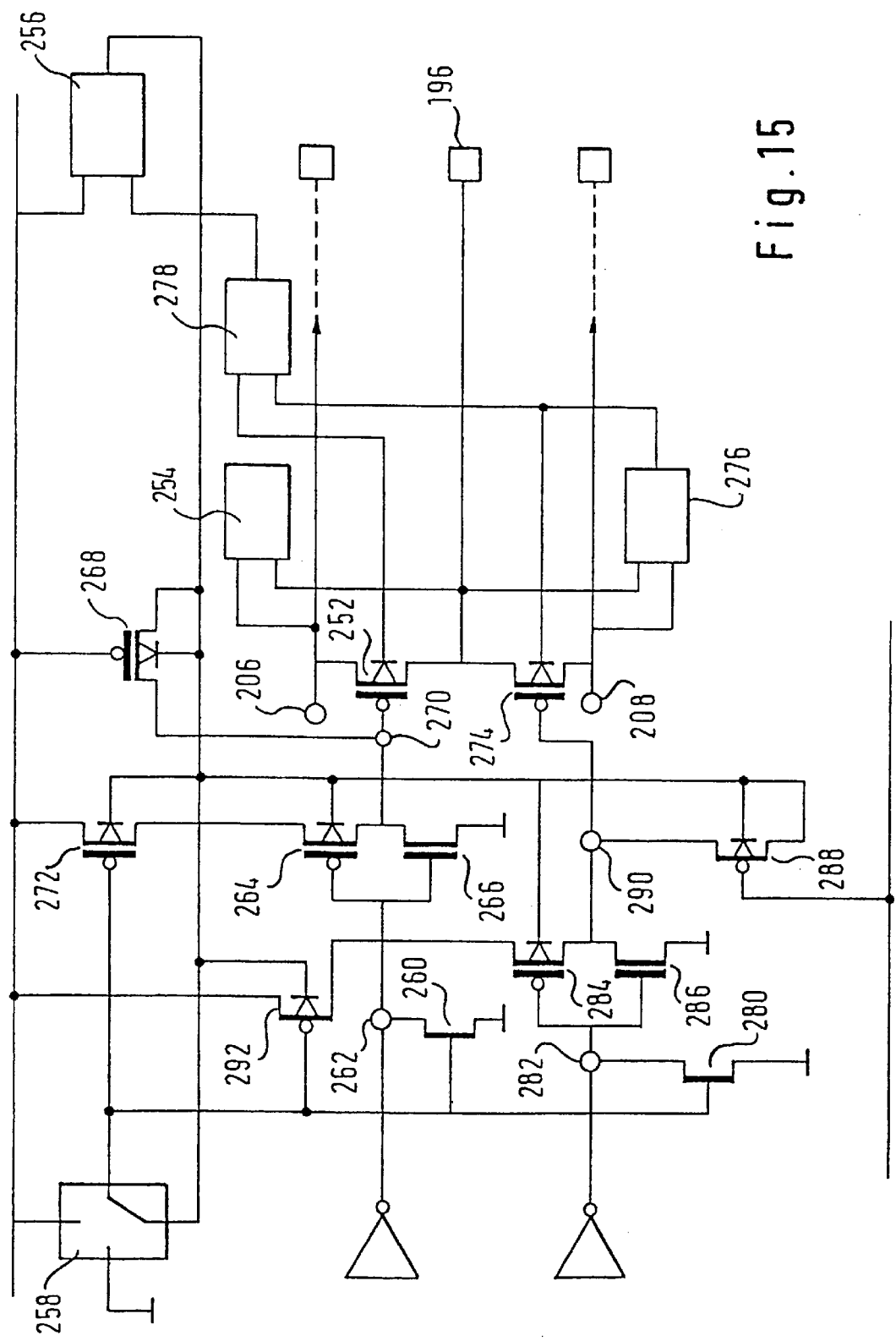
Figure 16:
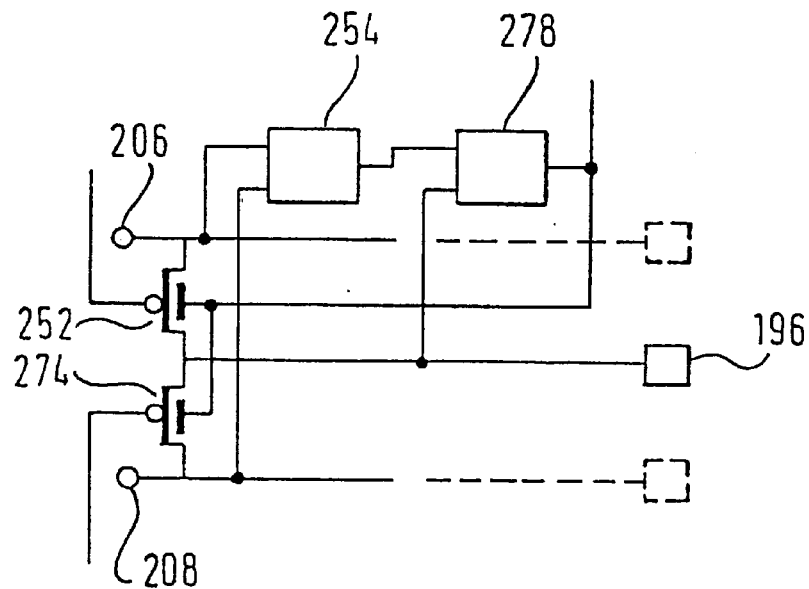
FIG. 16 shows a modification for the arrangement of the maximum generating circuits shown in FIG. 15.

This separation function requires a special arrangement shown in FIGS. 14 to 16. The major difference to the embodiments outlined above is that during power off when it is desirable to have the outputs freely floating they are completely independent from the supply lines to the input terminals 206, 208 so that even these supply lines can freely floating during power off.

As is shown in FIG. 14, to achieve this strict disconnection every output circuit is provided with a semiconductor switching means 252 of which the first terminal is connected to the first input terminal 206 of the output circuit 194. Further, the second terminal is connected to the output terminal 196 of the output circuit 194. A maximum generating circuit 254 receives at its input terminals the potentials at the input terminal and the output terminal of the output circuit. The maximum potential thereof is supplied to the insulating region of the semiconductor switching means 252 and also to one input terminal of a further maximum generating circuit that in addition receives the potential on the power supply line of the output circuit. The output potential of the maximum generating circuit 256 is supplied to a selector circuit 258 which is connected to the control electrode of an NMOS-transistor 260. The first electrode of the NMOS-transistor 260 is connected to the input terminal 262 of a driving circuit 264, 266 driving the semiconductor switching means 252. Further, the second electrode of the NMOS-transistor is connected to the second supply line of the output circuit, i.e. to ground.

As is shown in FIG. 14, there is further provided a PMOS-transistor 268 of which the control electrode is connected to the power supply line of the output circuit 194, the first electrode is connected to the output of the maximum generating circuit 256 and the second electrode is connected to the output terminal 270 of the driving circuit 264, 266. The output of the selector circuit 258 is also connected to a control electrode of a PMOS-transistor 272 of which the first terminal is connected to the power supply line of the output circuit 194 and the second terminal is connected to the first terminal of a PMOS-transistor 264 in the driving circuit 264, 266.

As outlined above, the circuit shown in FIG. 14 achieves a strict disconnection of the different signal lines in the output circuit 194. Firstly, the maximum generating circuit 254 derives the maximum potential at the power supply line connected to the first input terminal 206 and the output terminal 196 which is then used to bias the insulating region of the semiconductor switching means 252 as outlined above.

Further, the generated maximum, potential is also compared to the potential on the power supply line in the maximum generating circuit 256 so as to achieve the maximum potential in the output circuit. This overall maximum potential is then fed back via a selector circuit 258 to a control electrode of an NMOS-transistor 260. Therefore, during power off this NMOS-transistor 260 will be turned on so as to connect the input terminal 262 of the driving circuit 264, 266 to the second supply potential, i.e. to ground.

Still further, during power off the potential at the control electrode of the PMOS-transistor 268 is lower than the maximum potential applied to the first terminal thereof so that this PMOS-transistor 268 serves to tie the output terminal 270 of the driving circuit 264, 266 to the maximum potential in the output circuit 194. Therefore, the semiconductor switching means 252 is safely turned off to always achieve a perfect disconnection between the line connected to the input terminal 206 and the line connected to the output terminal 196 during power off of the output circuit. In addition, the PMOS-transistor 272 allows to disconnect the power supply line from the driving circuit 264, 266 during power off of the output circuit.

FIG. 15 shows a modified embodiment according to FIG. 14 which is adapted to a push-pull output circuit. There is provided a further semiconductor switching means 274 connected to the second input terminal 208 of the output circuit, and an additional maximum generating circuit 276 deriving the maximum potential at this input terminal 208 and the output terminal 196 of the output circuit. This maximum potential is fed back to the insulating regions of the semiconductor switching means 274 and also supplied to a maximum generating circuit 278 that receives the output potential of the maximum generating circuit 254. The maximum potential of the received input potentials is supplied to the maximum generating circuit 256.

In addition to the circuit elements described with respect to FIG. 14 there is provided an additional NMOS-transistor 280 connected to an input terminal 282 of a driving circuit 284, 286 driving the semiconductor switching means 274. Also, a PMOS-transistor 288 is connected with its first electrode to the output terminal 290 of the driving circuit 284, 286 and with its second electrode to the output of the maximum generating circuit 256. The control electrode of the PMOS-transistor 288 is connected to the first supply line, i.e. the same potential as the control electrode of the PMOS-transistor 268. A PMOS-transistor 292 is connected with its first electrode to the power supply line of the output circuit, with its second electrode to the first electrode of a PMOS-transistor 284 of the driving circuit 284, 286, and with its control electrode to the output of the selector circuit 258.

The functionality of the circuit shown in FIG. 15 basically corresponds to the functionality explained with respect to FIG. 14. Of particular importance is the simultaneous tying of the input terminals 262, 282 of both driving circuits 264, 266 and 284, 286 to ground via NMOS-transistors 260 and 280 during power off. Also, at the same time the output terminals 270, 290 are tied to the maximum potential in the output circuit via PMOS-transistors 268, 288 so as to safely guarantee a turned off state of the semiconductor switching circuits 252 and 274. Therefore, both the signal lines connected to the input terminals 206 and 208 of the output circuit and also the output lines are strictly disconnected which allows for an independent free floating of these lines during power off.

While according to FIG. 15 the insulating regions for the different PMOS-transistors are separated they can as well be supplied in a common mode, as is shown in FIG. 16. Further, the maximum generating circuit 254 may be substituted by resistors in case the potential difference at the input terminal 206, 208 of the differential output circuits is small, e.g., smaller than 2×Vd.

Figure 17:
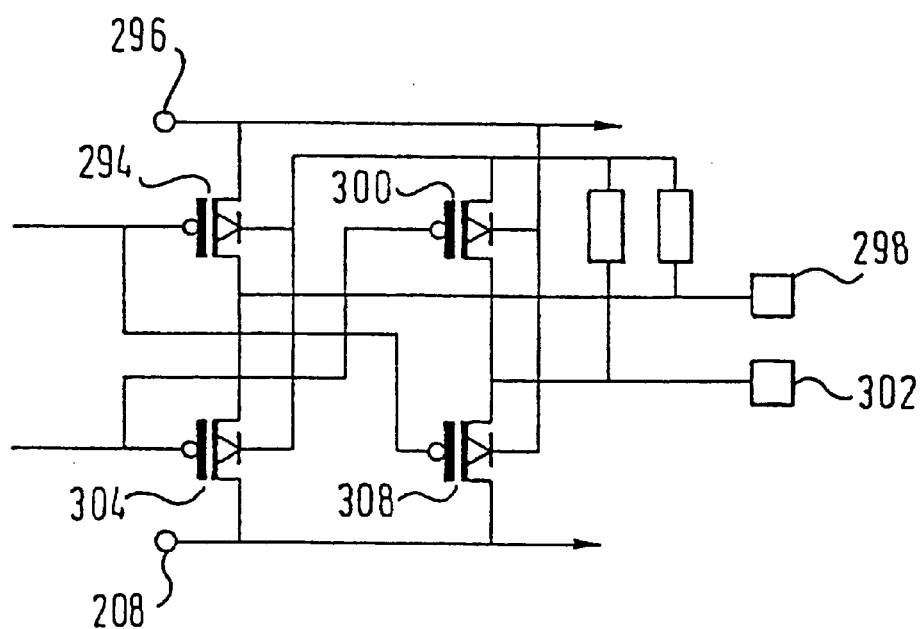
FIG. 17 shows a differential output section substituting the output section of the failsafe interface circuit shown in FIG. 11.
Figure 18:
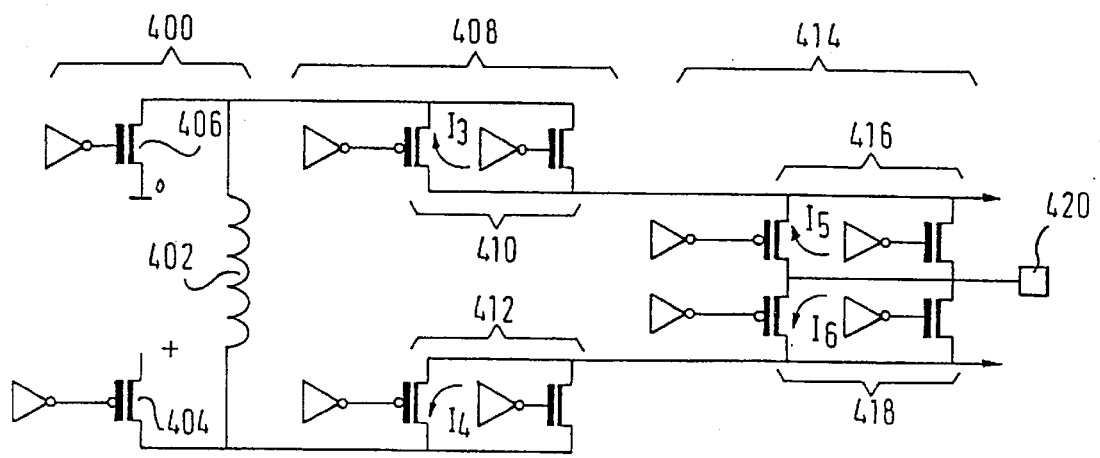
FIG. 18 shows a known interface circuit applied to differential transmission of digital data which is not failsafe.
Figure 19:
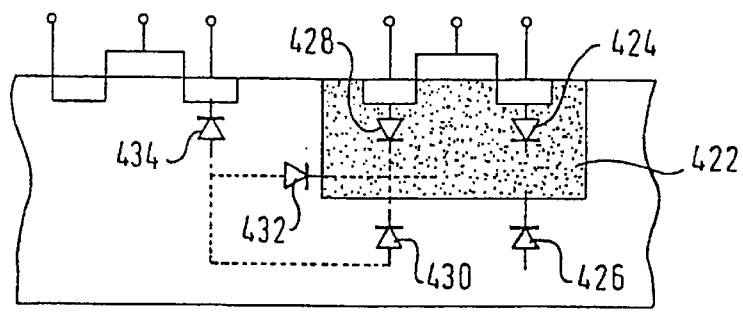
FIG. 19 shows parasitic diodes in a CMOS-circuit.

FIG. 17 shows an output circuit of the differential type. This output circuit comprises two output terminals 298 and 302 and two feedback resistors being connected such that the mean value of the output potentials created by the feedback resistors gives the potential to bias the insulating regions of PMOS-transistors 294, 300, 304 and 308 in the output circuit of the differential type.

The connection of the different PMOS-transistors 294, 300, 304 and 308 is such that the two output terminals 292 and 302 of this output circuit can relate to a pair of signaling wires for the transmission of digital data according to signaling concepts using differential signaling like differential positive emitter coupled logic DPECL, low voltage differential signaling LVDS and grounded low voltage differential signaling GLVDS.

Therefore, according to the invention there is provided a failsafe interface circuit for providing differential signals while keeping differential. voltages across pairs of signal wires low without any adverse effect on the quality of data transmission. Since this differential signaling approach leads only to a low power dissipation per unit area an integration into a single CMOS-circuit is possible in case precautions according to the invention are taken to avoid any backward feed phenomenon or latchup phenomenon in the integrated interface circuit.

Another advantage of the output circuit of the differential type shown in FIG. 17 is that the voltage across the output terminals 298 and 302 may float with respect to the voltage across the input terminals of the power supply circuit shown in FIG. 11. This means that a voltage across the input terminals of the power supply circuit and the output terminals 298 and 302 will not lead to a current flowing from the respective input terminals to the respective output terminals.

Therefore, the operation of the power supply circuit connected by the inventive failsafe interface circuit to the output circuit of the differential type is fully independent from the application of such voltages. Thus, the failsafe interface circuit according to the invention enables the prevention of output signals not conforming to differential signalling concepts.

While all circuits have been explained with respect to PMOS-transistors embedded in insulating regions realized as N-wells, the invention also applies to cases corresponding to substrates of the N-type and using insulating regions realized as P-wells. Here, care is taken about the NMOS-transistors in the same way as explained above with respect to PMOS-transistors. No particular care has to be taken with respect to PMOS-transistors. As outlined above, the substrate will be connected to the most positive potential in case the interface circuit is powered off.

Of course both approaches relating to a substrate of the P-type and a substrate of the n-type may be combined for twin well processes and lightly doped substrates of the p-type which may be treated in the same way as the substrate of the p-type having insulating regions realized as n-wells.

What is claimed is:

1. Interface circuit, comprising:
   at least one semiconductor switching means (44; 68) having a first link terminal (54; 64), a second link terminal (56; 66) and a control terminal (52; 72),
   said first link terminal (54; 64) being connected to a first circuit means (48; 80),
   said second link terminal (56; 66) being connected to a second circuit means (50; 82), and
   said semiconductor switching means (44; 68) being adapted to connect said first circuit means (48; 80) to said second circuit means (50; 82) when a potential difference between said control terminal (52; 72) and one of said first link terminal (54; 64) and said second link terminal (56; 66) exceeds a predetermined threshold value, and failure prevention means (60, 58; 70, 76, 78) adapted to apply the maximum potential of said first link terminal (54; 64) and said second link terminal (56, 66) to said control terminal (52; 72) in case said interface circuit is powered off, wherein said failure prevention means (60, 58; 70, 76, 78) comprises:
- a first maximum generating means (58; 70) adapted to output the maximum potential of said first link terminal (54; 64) and said second link terminal (56, 66), and
- a first selector means (60) connected to said first maximum generating means (58, 70) and being adapted to select the output thereof as power supply potential of a control amplifier feeding said control terminal (52; 72) in case said interface circuit is powered off.

2. Interface circuit according to claim 1, wherein said semiconductor switching means (44; 68) of a first conductivity type (P), and said failure prevention means (60, 58; 70, 76, 78) is further adapted to apply the maximum potential of said first link terminal (54; 64), said second link terminal (56; 66) to an insulating region (46; 74) in case said interface circuit is powered off.

3. Interface circuit according to claim 2, wherein said failure prevention means (70, 76, 78) comprises a second selector means (78) connected to said first maximum generating means (70) and being adapted to select the output thereof as potential supplied to said control terminal (72) when said interface circuit is powered off.

4. Interface circuit according to claim 3, wherein said first maximum generating means (12; 38; 58; 70) comprises:
- a first transistor switching means (84; 94) of said first conductivity type (P) with a control electrode being connected to a first input terminal (90; 100) of said first maximum generating means (12; 38; 58; 70), a first electrode being connected to a second input terminal (92; 102) of said first maximum generating means (12, 38; 58; 70), and a second electrode being connected to an output terminal (88; 98) of said first maximum generating means (12; 38; 58; 70), and
- a second transistor switching means (86; 96) of said first conductivity type (P) having a control electrode being connected to said second input terminal (92; 102) of said first maximum generating means (12; 38; 58; 70), a first electrode being connected to said second electrode of said first transistor switching means (84; 94), and a second electrode being connected to said first input terminal (90; 100) of said first maximum generating means (12; 38; 58; 70), wherein said output terminal (88; 98) of said first maximum generating means (12; 38; 58; 70) is connected to said second electrode of said first transistor switching means (84; 94) and said first electrode of said second transistor switching means (86; 96).

5. Interface circuit according to claim 4, wherein said first transistor switching means (94) and said second transistor switching means (96) are provided in insulating regions adapted to be biased to a potential at said output terminal (98) of said first maximum generating means (12; 38; 58; 70) when said interface circuit is powered off.

6. Interface circuit according to claim 4, wherein said first maximum generating means (12; 38; 58; 70) further comprises:
- a third transistor switching means (104; 126) of said first conductivity type (P) with a control electrode being connected to said first input terminal (118) of said first maximum generating means (12; 38; 58; 70), a first electrode being connected to said second input terminal (120) of said first maximum generating means (12; 38; 58; 70), and a second electrode connected to a current source means (112), and
- a fourth transistor switching means (106; 128) of said first conductivity type (P) having a control electrode being connected to said second input terminal (120) of said first maximum generating means (12; 38; 58; 70), a first electrode being connected to said second electrode of said third transistor switching means (104; 126), and a second electrode being connected to said first input terminal (118) of said first maximum generating means (12; 38; 58; 70), said first electrode also being connected to said current source means (112),
- a fifth transistor switching means (108; 130) of said first conductivity type (P) with a control electrode being connected to said current source means (112), a first electrode being connected to said second input terminal (120) of said first maximum generating means (12; 38; 58; 70), and a second electrode being connected to said output terminal (122) of said first maximum generating means (12; 38; 58; 70), and
- a sixth transistor switching means (110; 132) of said first conductivity type (P) having a control electrode being connected to said current source means (112), a first electrode being connected to said second electrode of said fifth transistor switching means (108; 130), and a second electrode being connected to said first input terminal (118) of said first maximum generating means (12; 38; 58; 70).

7. Interface circuit according to claim 6, wherein said third, fourth, fifth and sixth transistor switching means (104, 106, 108, 110; 126, 128, 130, 132) are provided in insulating regions adapted to be biased to a potential at said output terminal (122) of said first maximum generating means (12; 38; 58; 70) when said interface circuit is powered off.

8. Interface circuit according to claim 1, wherein said first circuit means (8; 24; 48; 80) is power supply means (92) for supplying power via said at least one semiconductor switching means (198; 202) to said second circuit means (10; 26; 50; 82).

9. Interface circuit according to claim 8, wherein said second circuit means (10; 26; 50; 82) is an output means (194) for driving a load.

10. Interface circuit according to claim 9, wherein said power supply means (192) and said output means (194) are coupled by
- a first semiconductor switching means (198) provided with said failure prevention means, said first semiconductor switching means (198) connecting a first output terminal (200) of said power supply means (192) and a first input terminal (206) of said output means (194), and
- a second semiconductor switching means (202) provided with said failure prevention means, said second semiconductor switching means (202) connecting a second output terminal (204) of said power supply means (192) and a second input terminal (208) of said output means (194).

11. Interface circuit according to claim 10, wherein said power supply means (192) further comprises:
- a reactance means (210) adapted to temporarily store energy and being connected to said first and second output terminal (200, 204) of said power supply means (192), and
- charging switching means (212, 214) being connected to said reactance means (210) and being adapted to provide a charging phase in which energy is supplied to said reactance means (210) from a power source and a discharging phase during which at least part of said energy stored in said reactance means (210) is discharged to said first and second output terminal (200, 204) of said power supply means (192).

12. Interface circuit according to claim 11, wherein said charging switching means (212, 214) comprises a third semiconductor switching means (212) provided with said conduction prevention means or said failure prevention means.

13. Interface circuit according to claim 12, wherein said output means (194) comprises:
- a third semiconductor switching means (216; 222) with a first link terminal, a second link terminal and a control terminal and comprising a failure prevention means adapted to apply the maximum potential of said first link terminal and said second link terminal to said control terminal in case said interface circuit is powered off or a failure prevention means adapted to apply the maximum potential of said first link terminal and said second link terminal to an insulating region of said fourth semiconductor switching means (216; 222) in case said interface circuit is powered off, and
- a fourth semiconductor switching means (218; 224) with a first link terminal, a second link terminal and a control terminal and comprising a failure prevention means adapted to apply the maximum potential of said first link terminal and said second link terminal to said control terminal in case said interface circuit is powered off or a failure prevention means adapted to apply the maximum potential of said first link terminal and said second link terminal to an insulating region of said fifth semiconductor switching means (218; 224) in case said interface circuit is powered off, where
- said third semiconductor switching means (216; 222) and said fourth semiconductor switching means (218; 224) are connected to an output terminal (196) of said output means and a first and a second input terminal (206, 208) of said output means, respectively.

14. Interface circuit according to claim 13, wherein a potential at said output terminal (196) is supplied via a resistor means (220) and a failure prevention means to a control terminal of said third semiconductor switching means (216) and said fourth semiconductor switching means (218) during power off of said interface circuit.

15. Interface circuit according to claim 13, wherein
- a tenth transistor switching means (238) of said first conductivity type (P) adapted to supply a first supply potential (VDD) to first driving circuit means (234, 236) driving said third semiconductor switching means (216) and said fourth semiconductor switching means (218) when said output means is powered on, and
- an eleventh transistor switching means (230) of said first conductivity type (P) adapted to supply said potential at said output terminal (196) of said output means via said resistor means (220) as supply potential to said first driving circuit means (234, 236) of said third semiconductor switching means (216) and said fourth semiconductor switching means (218), respectively, when said output means is powered off.

16. Interface circuit according to claim 15, wherein said third and fourth semiconductor switching means (216, 218; 222, 224) comprise p-channel MOSFETs of the first conductivity type (P).

17. Interface circuit according to claim 16, wherein there is provided a second maximum generating means (240) adapted to bias insulating regions of transistor switching means of said first conductivity type (P) in said interface circuit not comprised in said third and fourth semiconductor switching means (216, 218) to a maximum potential of a supply potential and said potential at said output terminal (196) of said output means.

18. Interface circuit according to claim 17, wherein there is provided a third maximum generating means (246) adapted to bias insulating regions of transistor switching means of said first conductivity type (P) comprised in said third and fourth semiconductor switching means (216, 218) to a maximum potential of said input terminals (206, 208) and said potential at said output terminal (196) of said interface circuit.

19. Interface circuit, comprising:
- at least one semiconductor switching means (44; 68) having a first link terminal (54; 64), a second link terminal (56; 66), and a control terminal (52; 72),
- said first link terminal (54; 64) being connected to a first circuit means (48; 80),
- said second link terminal (56; 66) being connected to a second circuit means (50; 82), and
- said semiconductor switching means (44; 68) being adapted to connect said first circuit means (48; 80) to said second circuit means (50; 82) when a potential difference between said control terminal (52; 72) and one of said first link terminal (54; 64) and said second link terminal (56; 66) exceeds a predetermined threshold value, and
- failure prevention means (60, 58; 70, 76, 78) adapted to apply the maximum potential of said first link terminal (54; 64) and said second link terminal (56, 66) to said control terminal (52; 72) in case said interface circuit is powered off, wherein
- said failure prevention means (60, 58; 70, 76, 78) comprises:
  - a first maximum generating means (58; 70) adapted to output the maximum potential of said first link terminal (54; 64) and said second link terminal (56, 66), and
  - a first selector means (60) connected to said first maximum generating means (58, 70) and being adapted to select the output thereof as power supply potential of a control amplifier feeding said control terminal (52; 72) in case said interface circuit is powered off, and
- said first selector means (14; 28; 60; 76; 78) comprises:
  - a first transistor switching means (150; 182) of a second conductivity type (N) having a control electrode being connected to a first power supply line (152), a first electrode being connected to a first input terminal (154) of said first selector means (14; 28; 60; 76; 78), and a second electrode being connected to an output terminal (156) of said first selector means, and
  - a seventh transistor switching means (158; 176) of a first conductivity type (P) having a control electrode being connected to a first power supply line (152), a first electrode being connected to said output terminal (156) of said first selector means (14; 28; 60; 76; 78), and a second electrode being connected to a second input terminal (160) of said first selector means (14; 28; 60; 76; 78), an eighth transistor switching means (162; 178) of said first conductivity type (P) having a control electrode, a first electrode being connected to said first input terminal (154) of said first selector means (14; 28; 60; 76; 78), and a second electrode being connected to said output terminal (156) of said selector means (14; 28; 60; 76; 78), a ninth transistor switching means (164; 180) of said first conductivity type (P) having a control electrode being connected to said first power supply line (152), a first electrode being connected to said control electrode of said eighth transistor switching means (162; 178), and a second electrode being connected to said second input terminal (160) of said first selector means (14; 28; 60; 76; 78), and a second transistor switching means (166; 184) of said second conductivity type (N) having a control electrode being connected to said first power supply line (152), a first electrode being connected to said control electrode of said eighth transistor switching means (162; 178), and a second electrode being connected to a second power supply line (168; 186).

20. Interface circuit according to claim 19, wherein said seventh, eighth and ninth transistor switching means (176, 178, 180) of said first conductivity type (P) are provided in an insulating region, respectively, and adapted to be biased to an externally generated bias potential (AN) when said interface circuit is powered off.

21. Interface circuit according to claim 20, wherein said first and second transistor switching means (182, 184) of said second conductivity type (N) are provided in an insulating region, respectively, and adapted to be biased to a potential of said second power supply line (186) when said interface circuit is powered off.

22. Interface circuit, comprising:

at least one semiconductor switching means (44; 68) having a first link terminal (54; 64), a second link terminal (56; 66), and a control terminal (52; 72), said first link terminal (54; 64) being connected to a first circuit means (48; 80), said second link terminal (56; 66) being connected to a second circuit means (50; 82), and said semiconductor switching means (44; 68) being adapted to connect said first circuit means (48; 80) to said second circuit means (50; 82) when a potential difference between said control terminal (52; 72) and one of said first link terminal (54; 64) and said second link terminal (56; 66) exceeds a predetermined threshold value, and failure prevention means (60, 58; 70, 76, 78) adapted to apply the maximum potential of said first link terminal (54; 64) and said second link terminal (56, 66) to said control terminal (52; 72) in case said interface circuit is powered off, wherein said failure prevention means (60, 58; 70, 76, 78) comprises:

a first maximum generating means (58; 70) adapted to output the maximum potential of said first link terminal (54; 64) and said second link terminal (56; 66), and a first selector means (60) connected to said second maximum generating means (58, 70) and being adapted to select the output thereof as power supply potential of a control amplifier feeding said control terminal (52; 72) in case said interface circuit is powered off, and said first circuit means (8; 24; 48; 80) is power supply means (92) for supplying power via said at least one semiconductor switching means (198; 202) to said second circuit means (10; 26; 50; 82), said second circuit means (10; 26; 50; 82) is an output means (194) for driving a load, and the output means comprises:

a fifth semiconductor switching means (252) having a first terminal connected to a first input terminal (206) of said output means and having a second terminal connected to an output terminal (196) of said output means, and a fourth maximum generating means (254) adapted to bias insulating regions in said fifth semiconductor switching means (252) to a maximum potential of said potential at said first input terminal (206) and said output terminal (196) of said output means.

23. Interface circuit according to claim 22, which further comprises:

a fifth maximum generating means (256) adapted to generate a maximum potential of said output potential of said fourth maximum generating means (254) and a power supply potential of said output means, a third selector means (258) adapted to provide the output potential of said fifth maximum generating means (256) to a control electrode of a third transistor switching means (260) of said second conductivity type (N) having its first electrode connected to an input terminal (262) of a second driving circuit means (264, 266) driving said third semiconductor switching means (252) and having its second electrode connected to a second supply line of said output means, and a twelfth transistor switching means (268) of said first conductivity type (P) adapted to connect the output terminal (270) of said second driving circuit means (264, 266) to said output potential of said fifth maximum generating means (256).

24. Interface circuit according to claim 23, wherein there is further provided a thirteenth transistor switching means (272) of said first conductivity type (P) adapted to disconnect said second driving circuit means (264, 266) from said power supply line during power off of said output means.

25. Interface circuit according to claim 23, wherein there is further provided a sixth semiconductor switching means (274) having a first terminal connected to said output terminal (196) of said output means and having a second terminal connected to said second input terminal (208) of said output means, respectively.

26. Interface circuit according to claim 25, wherein there is further provided a sixth maximum generating means (276) adapted to bias insulating regions in said sixth semiconductor switching means (274) to a maximum potential of said potential at said second input, terminal (208) and said output terminal (196) of said output means.

27. Interface circuit according to claim 26, wherein there is further provided a seventh maximum generating means (278) adapted to supply the maximum output potentials of said fourth maximum generating means (254) and said sixth maximum generating means (276) to said fifth maximum generating means (256).

28. Interface circuit according to claim 27, wherein said third selector means (258) is also adapted to supply the output of said fifth maximum generating means (256) to a control electrode of a fourth transistor switching means (280) of said second conductivity type (N) having a first electrode connected to an input terminal (282) of a third driving circuit means (284, 286) driving said sixth semiconductor switching means (274) and having a second terminal connected to said second supply line.

29. Interface circuit according to claim 28, wherein there is further provided a fourteenth transistor switching means (288) of said first conductivity type (P) adapted to connect said output terminal (290) of said third driving circuit means (284, 286) to said output terminal of said fifth maximum generating means (256).

30. Interface circuit according to claim 29, wherein there is further provided a fifteenth transistor switching means (292) of said first conductivity type (P) adapted to disconnect said third driving circuit means (284, 286) from said power supply line during power off of said output means.

31. Interface circuit according to claim 22, wherein said output means (194) is a differential output circuit comprising:
  a sixteenth transistor switching means (294) of said first conductivity type (P) with a control electrode, a first electrode connected to a first input terminal (296), and a second electrode connected to a first output terminal (298) of said output means (194),
  a seventeenth transistor switching means (300) of said first conductivity type (P) with a control electrode, a first electrode connected to said first input terminal (296), and a second electrode connected to a second output terminal (302) of said output means (194),
  an eighteenth transistor switching means (304) of the first conductivity type (P) with a control electrode, a first electrode connected to said first output terminal (298) of said output means (194), and a second electrode connected to a second input terminal (306), and
  a nineteenth transistor switching means (308) of the first conductivity type (P) with a control electrode, a first electrode connected to said second output terminal (302) of said output means (194), and a second electrode connected to said second input terminal (306) of said output means (194).

32. interface circuit according to claim 31, wherein each insulating region of said twelfth to fifteenth transistor switching means (294, 300, 304, 308) is biased to an average potential of said first and second output terminal (298, 302) of said output means (194).

33. Interface circuit according to claim 31, wherein each of said transistor switching means of the first conductivity type (P) is a p-channel MOSFET transistor.

34. Interface circuit according to claim 31, wherein each of said transistor switching means of the second conductivity type (N) is an n-channel MOSFET transistor.

35. Interface circuit according to claim 31, wherein each of said insulating regions is an N-well.

36. Failure prevention method for an interface circuit comprising at least one semiconductor switching means (1) having a first link terminal (2), a second link terminal (4), and a control terminal (6), said semiconductor switching means (1) being activated when a potential difference between said control terminal (6) and one of said first link terminal (2) and said second link terminal (4) exceeds a predetermined threshold value, comprising the step:
  apply the maximum potential of said first link terminal (2) and said second link terminal (4) to a control amplifier feeding said control terminal (6) of said semiconductor switching means (1) when said interface circuit is powered off.

37. Failure prevention method according to claim 36, further comprising the step of applying the maximum potential of said first link terminal (2) and said second link terminal (4) to an insulating region of said semiconductor switching means (1) when said interface circuit is powered off.

* * * * *